(12) United States Patent
Trobough

(10) Patent No.: US 7,641,481 B2
(45) Date of Patent: Jan. 5, 2010

(54) NON-INTRUSIVE INTERPOSER FOR ACCESSING INTEGRATED CIRCUIT PACKAGE SIGNALS

(75) Inventor: Mark Trobough, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 11/870,064

(22) Filed: Oct. 10, 2007

(65) Prior Publication Data

US 2009/0197436 A1 Aug. 6, 2009

(51) Int. Cl.
H01R 12/00 (2006.01)
(52) U.S. Cl. .......................... 439/70; 439/66
(58) Field of Classification Search ............. 439/70–73, 439/66
See application file for complete search history.

(56) References Cited

U.S. PATENT DOCUMENTS

| | | | | |
|---|---|---|---|---|
| 4,076,357 A | * | 2/1978 | Cistola | 439/65 |
| 5,934,914 A | * | 8/1999 | Fjelstad et al. | 439/82 |
| 6,015,301 A | * | 1/2000 | Brodsky et al. | 439/73 |
| 6,712,621 B2 | * | 3/2004 | Li et al. | 439/65 |
| 6,746,255 B1 | * | 6/2004 | Lee et al. | 439/108 |
| 7,029,288 B2 | * | 4/2006 | Li | 439/66 |
| 7,048,549 B1 | * | 5/2006 | Swain | 439/66 |
| 7,539,027 B2 | * | 5/2009 | Callahan et al. | 361/803 |

* cited by examiner

*Primary Examiner*—Truc T Nguyen
(74) *Attorney, Agent, or Firm*—Grossman, Tucker, Perreault & Pfleger, PLLC

(57) ABSTRACT

Disclosed is an interposer for accessing one or more signals from an Integrated Circuit (IC) package. The interposer is disposed between the IC package and a socket body. The interposer comprises a plurality of clearance holes and at least one connecting element. The plurality of clearance holes allows an array of contacts on a first surface of the socket body to pass through the interposer and make electrical contact with a first set of contacts of a plurality of contacts of the IC package. The at least one connecting element is configured to make electrical contact with a second set of contacts of the plurality of contacts of the IC package. The electrical contact between the at least one connecting element and the second set of contacts of the plurality of contacts of the IC package provides access to the one or more signals from the IC package.

16 Claims, 5 Drawing Sheets

NON-INTRUSIVE INTERPOSER FOR ACCESSING INTEGRATED CIRCUIT PACKAGE SIGNALS

FIELD OF THE DISCLOSURE

The present disclosure generally relates to validation and debug-operations in Integrated Circuit (IC) packages, and more particularly, to an interposer disposed between an IC package and a socket body for accessing selective IC package signals.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting. The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The present disclosure provides an interposer for accessing one or more signals from an Integrated Circuit (IC) package. The interposer is disposed between the IC package and a socket body. The interposer comprises a plurality of clearance holes and at least one connecting element. The plurality of clearance holes allows an array of contacts on a first surface of the socket body to pass through the interposer and make electrical contact with a first set of contacts of a plurality of contacts of the IC package. The at least one connecting element is configured to make electrical contact with a second set of contacts of the plurality of contacts of the IC package. The electrical contact between the at least one connecting element and the second set of contacts of the plurality of contacts of the IC package provides access to the one or more signals from the IC package. Further, the interposer is designed to be non-intrusive and has minimal impact on the typical operations of the IC package.

Figure 1:
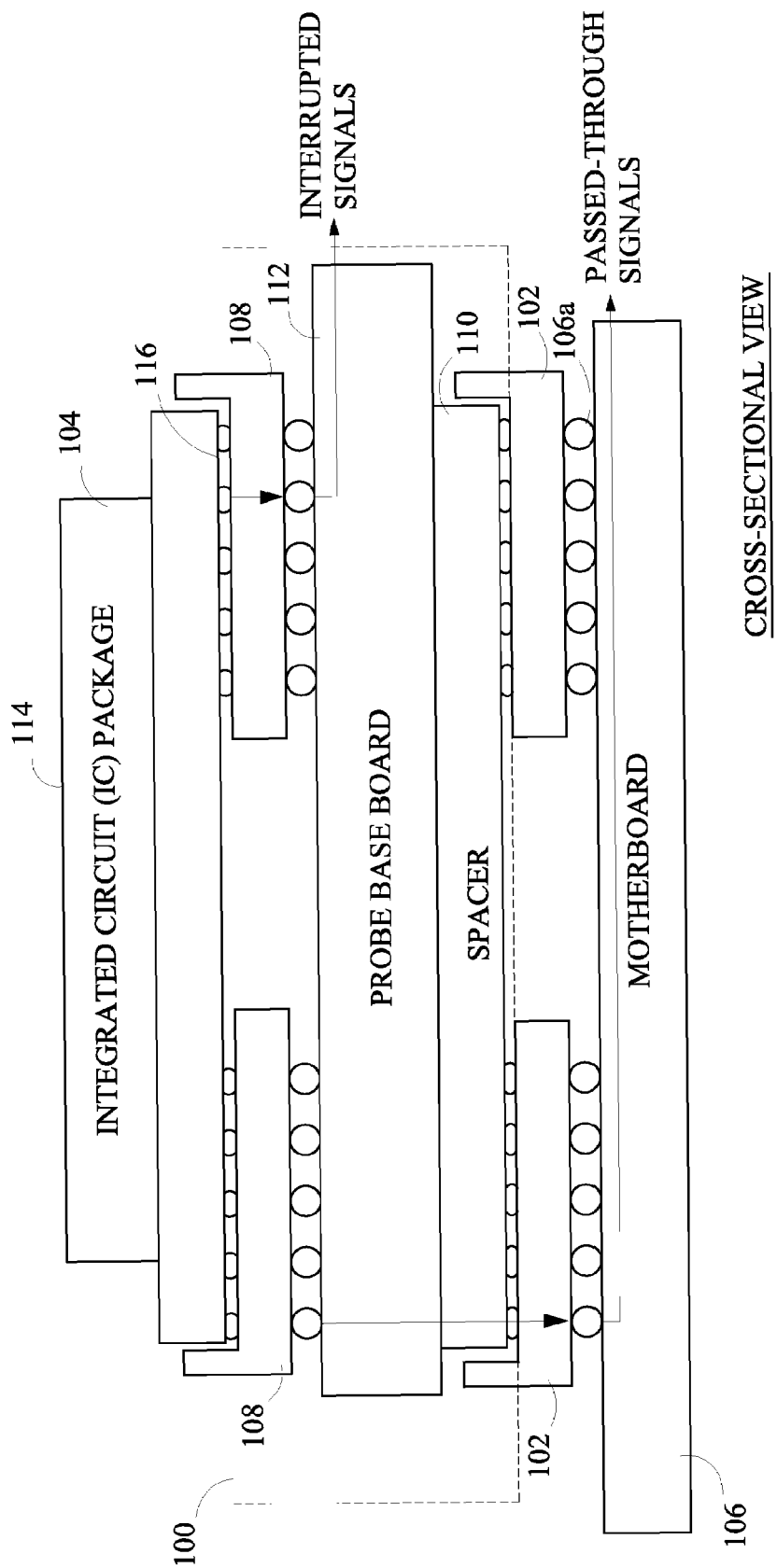
FIG. 1 is a cross-sectional view of an arrangement of a stacked-socket interposer assembly disposed between a first land grid array socket body and an Integrated Circuit (IC) package.

FIG. 1 is a cross-sectional view of an arrangement of a stacked-socket interposer assembly 100 disposed between a first land grid array socket body 102 and an Integrated Circuit package 104. The first land grid array socket body 102 is surface mounted on a motherboard 106 using typical surface mounting techniques. For example, a matrix of soldered balls such as soldered ball 106a may be used to surface mount the first land grid array socket body 102 on the motherboard 106. The stacked-socket interposer assembly 100 includes a second land grid array socket body 108, a spacer 110 and a probe base board 112. The IC package 104 has a top surface 114 and a bottom surface 116. The top surface 114 faces away from the motherboard 106 and the bottom surface 116 faces towards the motherboard 106. The bottom surface 116 includes a plurality of contacts such as a first set of contacts and a second set of contacts (not shown).

The first set of contacts and the second set of contacts of the plurality of contacts together serve as access points for accessing a plurality of signals associated with processes performed by the IC package 104. For example, the plurality of signals may correspond to program execution, software error testing and such other processes of IC package 104. The plurality of signals are accessed when the plurality of contacts make electrical contact with contacts (not shown) provided on the second land grid array socket body 108.

The second land grid array socket body 108 is mounted on the probe base board 112 in a manner similar to the mounting of the first land grid array socket body 102 on the motherboard 106 (using a matrix of soldered balls such as a soldered ball 106a). The probe base board 112 includes electrical elements which serve to perform functions such as power delivery, signal termination, power supply bypassing and the like. The probe base board 112 may allow one or more signals of the plurality of signals accessed by the second land grid array socket body 108 to be interrupted (hereinafter referred to as interrupted signals). The interrupted signals may be routed over etched traces provided on the probe base board 112 to connectors (not shown) which may further be connected to validation equipment such as In-Target Probe (ITP) hardware (not shown) and the like.

The probe base board 112 may also allow non-interrupted signals (hereinafter referred to as passed-through signals) to pass through the probe base board 112 into the spacer 110. The spacer 110 serves to provide the necessary separation for mounting the probe base board 112 onto the first land grid array socket body 102. The spacer 110 further allows the passed-through signals to pass through the spacer 110 to the first land grid array socket body 102. The passed-through signals are then passed on to the motherboard 106 by the first land grid array socket body 102 for routing to elements (not shown) such as memory modules and the like, mounted on the motherboard 106.

Though the stacked-socket interposer assembly 100 provides access to the plurality of signals from the IC package 104, mechanical modifications may be required to be made to a retention mechanism (not shown) of the first land grid array socket body 102. The retention mechanism of the first land grid array socket body 102 is typically designed to accommodate only the IC package 104. The introduction of the stacked-socket interposer assembly 100 results in significant addition to thickness and as such mechanical modifications may be required to be made to the retention mechanism of the first land grid array socket body 102. Further, it will be evident to those skilled in the art that the introduction of the stacked-socket interposer assembly 100 results in significant signaling challenges and limitations, especially for high speed signals such as single-ended Double Data Rate (DDR), Front Side Bus (FSB), and even differential buses such as Peripheral Component Interconnect Express (PCIE), which can render these types of signals inoperable when the stacked socket interposer is installed into the system via the LGA socket.

Figure 2:
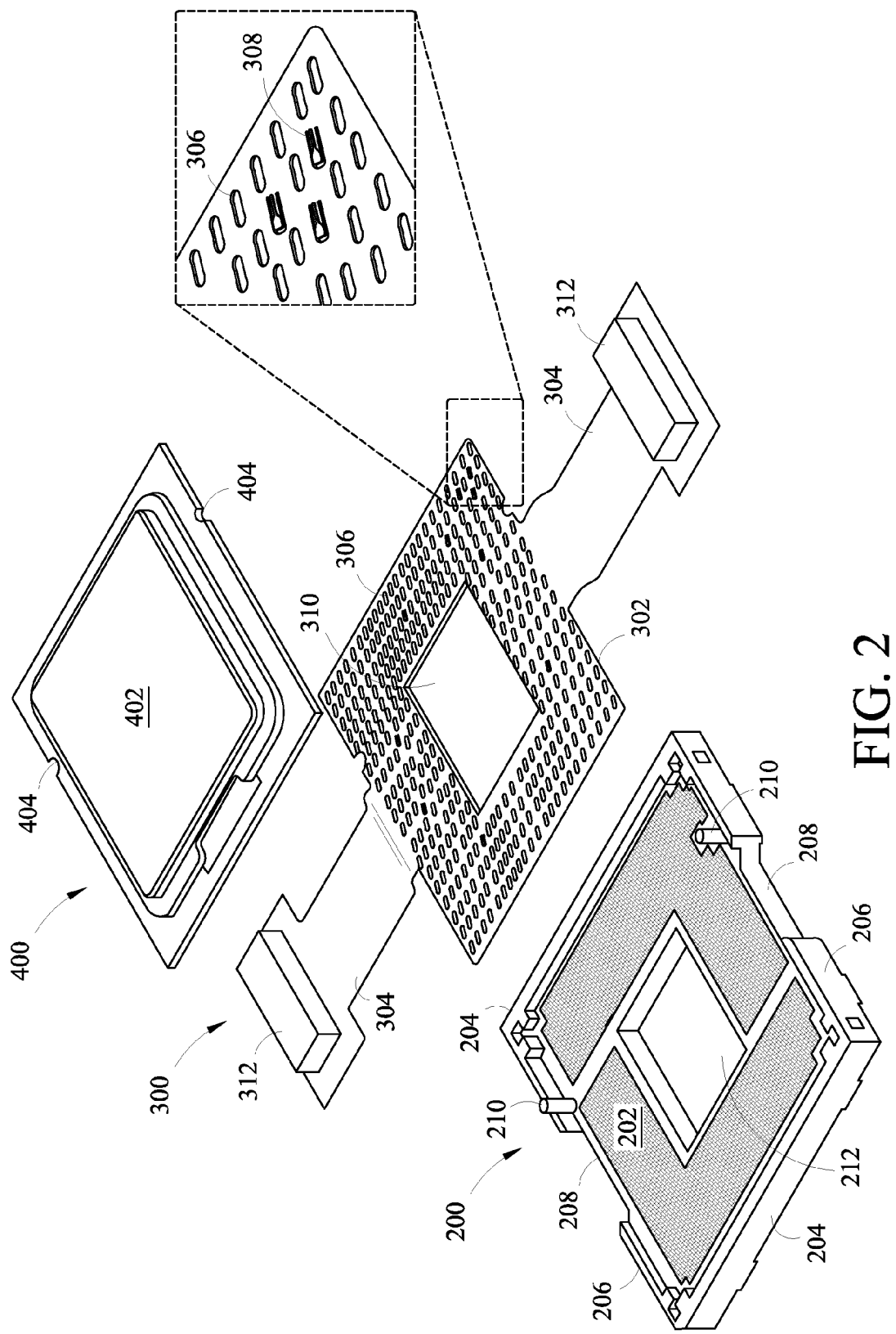
FIG. 2 is an exploded isometric view depicting an arrangement of an interposer disposed between a socket body and an Integrated Circuit (IC) package, in accordance with an embodiment of the present disclosure.

FIG. 2 is an exploded isometric view depicting an arrangement of an interposer 300 disposed between a socket body 200 and an Integrated Circuit (IC) package 400, in accordance with an embodiment of the present disclosure. The socket body 200 includes an array of contacts (not shown) on a first surface 202. The array of contacts are configured to make electrical contact with a plurality of contact pads (not shown) on the IC package 400. The IC package 400 includes a top surface 402 and a bottom surface (not shown). The bottom surface of the IC package 400 is configured with the plurality of pads or lands and may be placed on the array of contacts provided on the first surface 202 of the socket body 200.

The socket body 200 includes two side walls 204 opposite and spaced apart and two end walls 206 connecting the two side walls 204 in a manner such that the first surface 202, the two side walls 204 and the two end walls 206 configure a receiving space therebetween. Such an arrangement of the socket body 200, for example, configures a rectangular structure capable of accommodating the Integrated Circuit (IC) package 400 therein. The socket body 200 may be surface mounted on a printed circuit board (not shown) with the first surface 202 facing away from the printed circuit board (PCB).

The first surface 202 includes an array of contacts on the first surface 202 configured to make electrical contact with the plurality of contacting pads on the IC package 400. The array of contacts may be of any suitable material such as gold-plated copper and the like. The array of contacts may be arranged in a fashion facilitating electrical connectivity with the contact pads of the IC Package 400. For example, the array of contacts may be arranged in a grid array fashion. Further, each of the two end walls 206 of the socket body 200 defines a groove 208 (hereinafter referred together as grooves 208). Once the IC package 400 is accommodated into the receiving space of the socket body 200, the grooves 208 provide space for grabbing the IC package 400 using human fingers for removing the IC package 400 from the socket body 200.

It will be evident to those skilled in the art that peripheral edges of the receiving space of the socket body 200 may include engagement features such as a cylindrical protrusion 210 for coupling the IC package 400 to the socket body 200. The IC package 400 may have complimentary engagement features on peripheral edges, such as cut-out portions 404, to couple the IC package 400 with the socket body 200.

The interposer 300 disposed between the socket body 200 and the IC package 400 may be in the form of a flexible circuit board. The interposer 300 (hereinafter referred to as flexible circuit board 300) includes a main portion 302 and two extending portions 304 extending away from the main portion 302. The main portion 302 of the flexible circuit board 300 may be dimensioned to fit in the receiving space of the socket body 200 and as such the peripheral edges of the main portion 302 may configure a rectangular structure. The main portion 302 of the flexible circuit board 300 is disposed between the socket body 200 and the IC package 400. The two extending portions 304 extend away from peripheral edges of the main portion 302 of the flexible circuit board 300. The width of each of the two extending portions 304 may be designed to fit the width of the grooves 208, and as such the two extending portions 304 extend out of the socket body 200 through the grooves 208 provided in the two end walls 206 of the socket body 200. The main portion 302 of the flexible circuit board 300 includes a plurality of clearance holes 306 and at least one connecting element such as connecting element 308 disposed between the plurality of clearance holes 306. Further, the main portion 302 includes a central cavity 310 which aligns with central cavity 212 defined in the receiving space of the socket body 200. The plurality of clearance holes 306 are disposed around the central cavity 310 of the main portion 302.

The plurality of clearance holes 306 are designed in shapes that allow the array of contacts on the first surface 202 of the socket body 200 to pass through the flexible circuit board 300 and make electrical contact with the first set of contacts (not shown) of the plurality of contacting pads of the IC package 400. Program instructions for execution of the operations of the IC package 400 may be communicated through the electrical contact between the first set of contacting pads of the IC package 400 and the array of contacts on the first surface 202 of the socket body 200. A second set of contacts (not shown) of the plurality of contacting pads of the IC package 400 may be electrically shunted from contacting the array of contacts on the first surface 202 of the socket body 200 by the at least one connecting element such as the connecting element 308 disposed between the second set of contacts of the IC package and the array of contacts of the socket body 200. Further, the at least one connecting element is configured with requisite conducting surface (explained in conjunction with FIG. 3) to make electrical contact with the second set of contacts of the plurality of contacts of the IC package 400.

The first set of contacts and the second set of contacts of the plurality of contacts of the IC package 400 correspond to program signals of the IC package 400. The plurality of clearance holes 306 are designed to mechanically and electrically correspond to specific signals of the IC package 400, such as those signals (hereinafter referred to as passed-through signals) which correspond to normal operations of the IC package 400. The plurality of clearance holes 306 allow the array of contacts on the first surface 202 of the socket body 200 to make the typical connection with the first set of contacting pads of the IC package to access the passed-through signals.

The second set of contacts of the plurality of contacts of the IC package 400 may correspond to one or more signals (hereinafter referred to as interrupted signals) of the plurality of signals. The second set of contacts makes electrical contact with the at least one connecting element thereby providing access to the interrupted signals, such as the debug signals. The interrupted signals are routed from the at least one connecting element to the peripheral edges of the main portion 302 of the flexible circuit board 300 using etched traces on the flexible circuit board 300. The interrupted signals may then be routed out of the socket body 200 using the two extending portions 304 which extend out through the grooves 208 provided in the two end walls 206 of the socket body 200. It will be evident to those skilled in the art that the flexible circuit board 300 may extend out of other relieved sections provided in peripheral walls of the socket body 200. The two extending portions 304 include debug interfaces 312 at respective ends of the two extending portions 304. The debug interfaces 312 may be interfaced with hardware (not shown) used for debug operations. An example of the debug interfaces 312 may be an In-Target Probe (ITP) debug connector.

An example of the IC package 400 may include a Central Processing Unit (CPU) processor. An example of the socket body 200 may include but is not limited to a Land Grid Array (LGA) socket body. The arrangement of the interposer 300 disposed on the socket body 200 will be explained in further detail in conjunction with FIG. 3.

Figure 3:
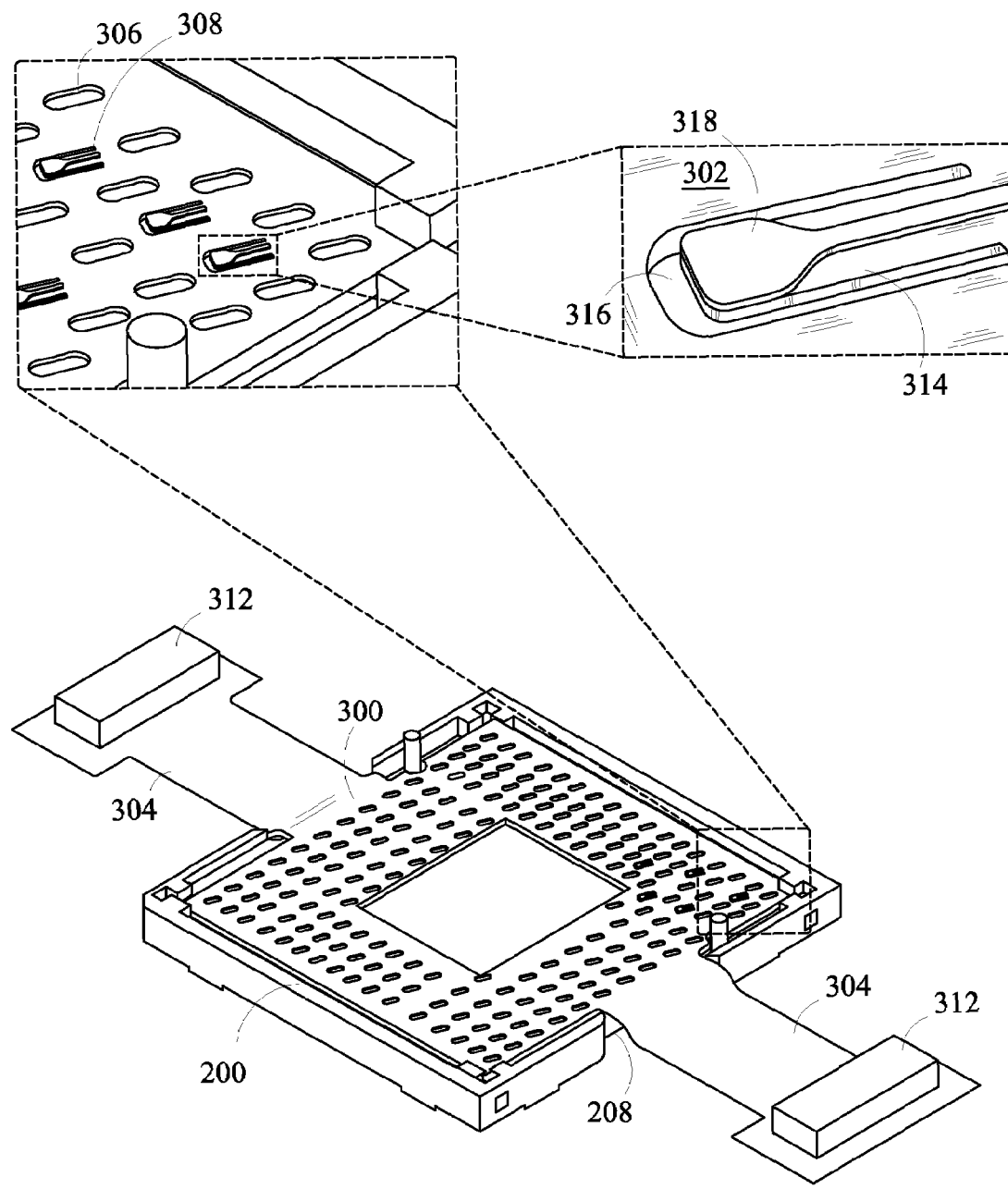
FIG. 3 is an isometric view depicting the interposer of FIG. 2 disposed on the socket body, in accordance with an embodiment of the present disclosure.

FIG. 3 is an isometric view depicting the interposer 300 of FIG. 2 disposed on the socket body 200, in accordance with an embodiment of the present disclosure. As explained in conjunction with FIG. 2, peripheral edges of the receiving space of the socket body 200 may include engagement features for coupling the IC package 400 to the socket body 200. The interposer 300 (flexible circuit board 300) has complimentary engagement features at the peripheral edges of the main portion 302, similar to those on peripheral edges of the IC package 400, enabling the main portion 302 of the flexible circuit board 300 to align and fit snugly in the receiving space of the socket body 200.

The array of contacts on the first surface 202 of the socket body 200 may be typically cantilever-shaped metal springs and may require a working/deflection range of typically 15 mils. The flexible circuit board 300 may be designed to have minimal thickness to be non-intrusive and produce little effect on the relatively large working deflection of the array of contacts of the socket body 200, when the flexible circuit board 300 is disposed between the IC package 400 and the socket body 200. The minimal thickness of the flexible circuit board 300 ensures that the flexible circuit board 300 is non-intrusive and that the electrical connection between the array of contacts of the socket body 200 (passing through the plurality of clearance holes 306) and the first set of contacting pads of the IC package 400 is unaffected. In accordance with one embodiment of the present disclosure, the flexible circuit board 300 may be designed with two copper layers to have a total thickness of 2-3 mils. Copper layers may further be added to increment the thickness of the flexible circuit board 300 by 1-1.5 mils.

Further, as explained in conjunction with FIG. 2, the at least one connecting element of the interposer 300 makes electrical contact with the second set of contacts of the plurality of contacting pads of the IC package 400, thereby electrically shunting the second set of contacts from contacting the array of contacts on the first surface 202 of the socket body 200. The contacts of the array of contacts below the at least one connecting element may over-deflect thereby causing damage to those contacts of the array of contacts. The at least one connecting element such as the connecting element 308 on the flexible circuit board 300 may further be designed to have thickness less than rest of flexible board 300. For instance, techniques such as partial laser ablation, polymer etching, or voiding solder mask behind the at least one connecting element may be used to selectively thin down the at least one connecting element.

In accordance with an embodiment of the present disclosure, the at least one connecting element includes a flexible portion capable of being raised to make electrical contact with the second set of contacts of the plurality of contacting pads of the IC package 400. In accordance with another embodiment of the present disclosure, the flexible portion of each of the at least one connecting element such as connecting element 308 may be in the form of a cantilever structure 314 hinged at one end of a cut-out 316 and extending into the cut-out 316 on the main portion 302 of the flexible circuit board 300. The cut-out 316 may be designed as a through-hole in the flexible circuit board 300. The cantilever structure 314 may resemble a protrusion (of the flexible circuit board 300) extending from one peripheral edge of the cut-out 316 into the through-hole and terminating at a pre-determined distance from the opposite peripheral edge of the cut-out 316. The flexible portion of the at least one connecting element is suitably designed in the form of the cantilever structure 314 to ensure compliance when the at least one connecting element makes electrical contact with the second set of contacts of the IC package 400. Further, the cantilever structure 314 has an exposed conducting surface 318 on a top surface contacting the second set of contacts of the IC package 400 to facilitate electrical connection. The hinging of the cantilever structure 314 at one end further adds flexibility to the at least one connecting element. When the flexible circuit board 300 is disposed on the socket body 200, the large deflection of the array of contacts on the first surface 202 of the socket body 200 raises the hinged cantilever structure 314, thereby facilitating the electrical connection of the exposed conducting surface 318 with the second set of contacts of the IC package 400.

Further, as explained in conjunction with FIG. 2, connecting elements such as the connecting element 308 of the at least one connecting element are disposed at pre-determined locations between the plurality of clearance holes 306 on the flexible circuit board 300. The pre-determined locations may correspond to locations for making electrical contact with second set of contacting pads of the IC package 400. Manufacturing techniques such as laser ablation and plasma etching, typically used for flexible circuit boards and organic substrates, may be used to selectively form the at least one connecting element on the flexible circuit board 300. During socket actuation, considerable force is exerted by the array of contacts of the socket body 200 on the at least one connecting element. The flexible portion, such as the cantilever structure 314, of the at least one connecting element may be designed to deflect the exposed conducting surface 318 of the at least one connecting element towards the corresponding second set of contacts of the plurality of contacting pads of the IC package 400. The arrangement of the IC package 400 on the socket body 200 is illustrated in FIG. 4.

Figure 4:
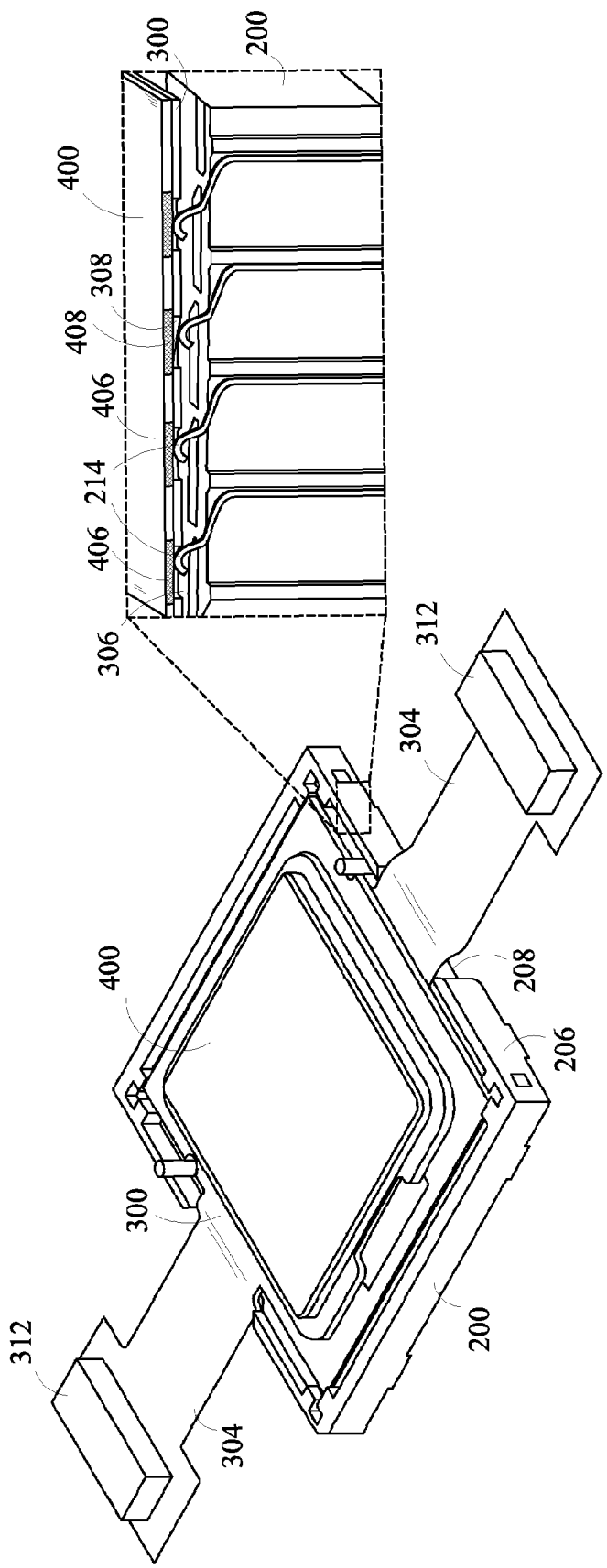
FIG. 4 illustrates an arrangement of the IC package on the socket body with the interposer of FIG. 2 disposed in between the IC package and the socket body, in accordance with an embodiment of the present disclosure.

FIG. 4 illustrates an arrangement of the IC package 400 on the socket body 200 with the interposer 300 of FIG. 2 disposed in between the IC package 400 and the socket body 200, in accordance with an embodiment of the present disclosure. As explained in conjunction with FIG. 2, the receiving space of the socket body 200 is configured to receive the IC package 400. The peripheral edges of the receiving space has engagement features which engage with complimentary engagement features provided on peripheral edges of the IC package 400 to couple the IC package 400 to the socket body 200. The interposer 300 is disposed in between the IC package 400 and the socket body 200, with the main portion 302 being accommodated in the receiving space of the socket body 200. The two extending portions 304 of the interposer 300 extend out of the socket body 200 through the grooves 208 provided in the two end walls 206 of the socket body 200.

When the socket actuation forces are applied by means of a loading mechanism (depicted in FIG. 5B), the array of contacts of the socket body 200 pass through the plurality of clearance holes 306 provided on the main portion 302 of the interposer 300 to make electrical contact with the first set of contacts of the plurality of contacting pads of the IC package 400. The contacts of the array of contacts of the socket body 200 below the at least one connecting element of the interposer 300 exert an upward force on the at least one connecting element, raising the flexible portion, such as the cantilever structure 314, of the at least one connecting element. The raising of the flexible portion of the at least one connecting element, brings the exposed conducting surface 318 on the top surface of the flexible portion to make electrical contact with the second set of contacts of the plurality of contacts of the IC package 400. The electrical connections are magnified and depicted (inset) in a simplified cross-sectional view of the arrangement of the IC package 400 mounted on the socket body 200 with the interposer 300 disposed there between.

The cross sectional view of the arrangement illustrates cross sections of the IC package 400, the interposer 300 and the socket body 200. As illustrated, the interposer 300 is disposed between the IC package 400 and the socket body 200. Array of contacts 214 of the socket body 200 passing through the plurality of clearance holes 306 make electrical contact with the first set of contacts 406 of the plurality of contacts of the IC package 400. The contacts of the array of contacts 214 blocked by the at least one connecting element such as the connecting element 308 of the at least one connecting element raises the flexible portion of the connecting element 308 to make electrical contact with second set of contacts 408 of the plurality of contacts of the IC package 400. As explained in conjunction with FIG. 2, the electrical contact between the at least one connecting element of the interposer 300 and the second set of contacts 408 of the IC package 400 provides access to one or more signals from the IC package 400. The one or more signals may be routed to the peripheral edges of the main portion 302 of the interposer 300 using etched traces and may then be routed out of the socket body 200 using the two extending portions 304 to connectors such as debug connectors.

Figure 5A:
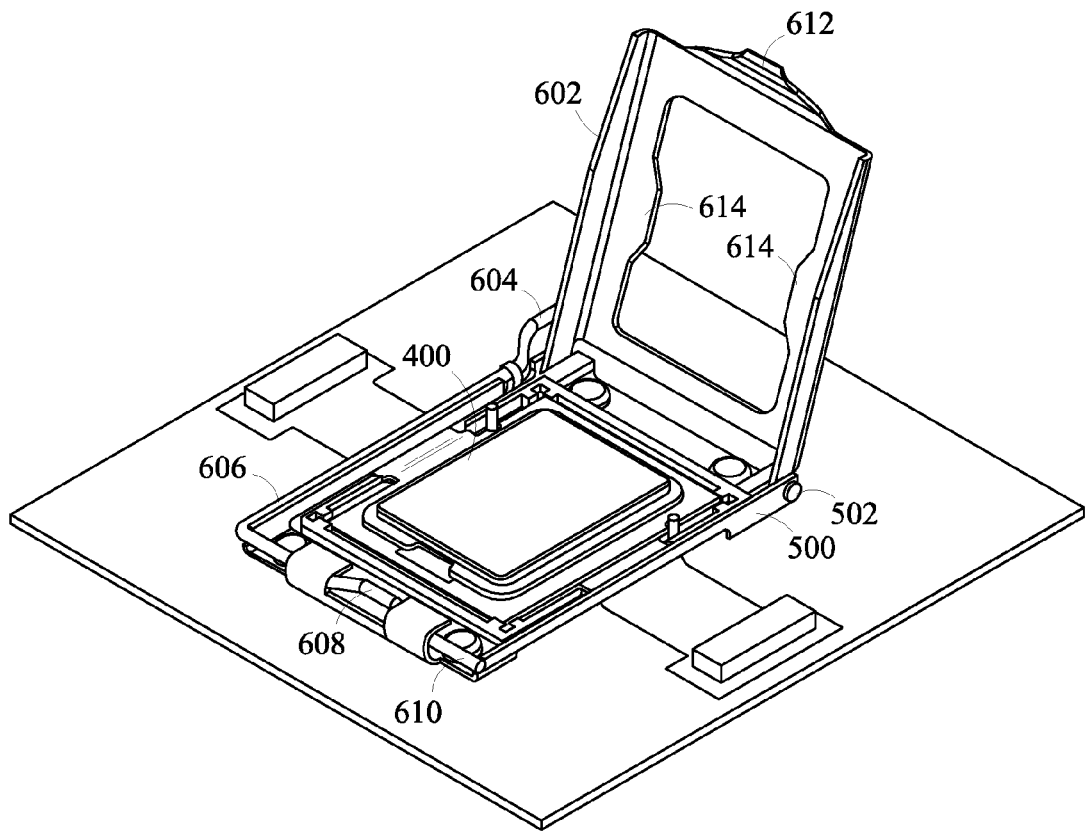
FIGS. 5A and 5B illustrate a loading mechanism mounted over an IC package and an actuation of socket load on the IC package respectively, in accordance with an embodiment of the present disclosure.
Figure 5B:
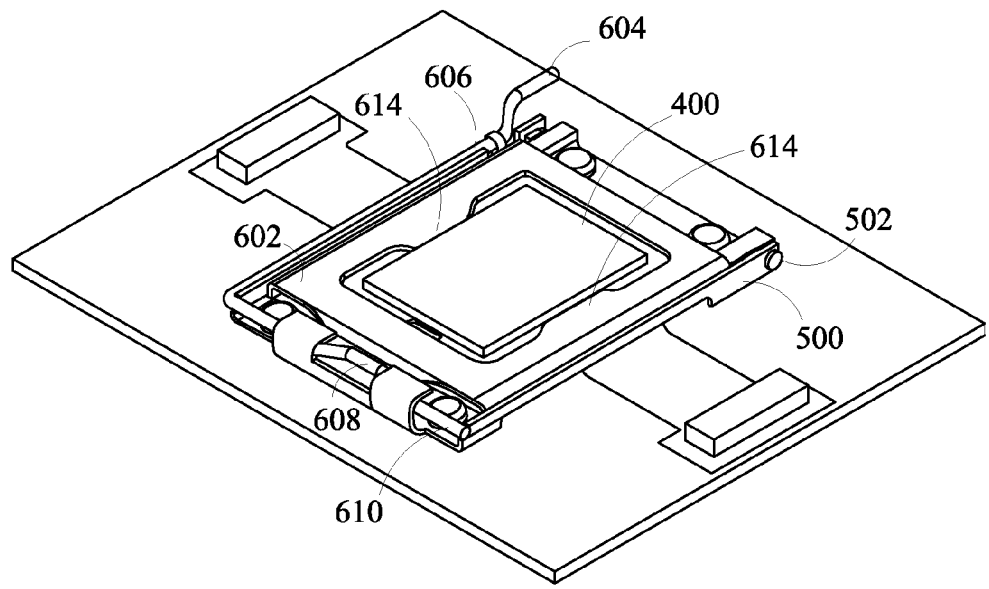

FIGS. 5A and 5B illustrate a loading mechanism mounted over an IC package 400 and an actuation of socket load on the IC package 400 respectively, in accordance with an embodiment of the present disclosure. In FIG. 5A, the IC package 400 is accommodated into the receiving space of the socket body 200 with the interposer 300 disposed in between the IC package 400 and the socket body 200, as explained in conjunction with FIG. 4. A socket body frame 500 coupled with a loading mechanism (not shown) is mounted on the IC package 400 enclosing the socket body 200. The loading mechanism includes a loading plate 602 and a lever 604. The loading plate 602 is hinged at one end of the socket body frame 500 using nuts such as nut 502. The loading plate 602 may rotate about the hinge to assume one of an open and a closed position using the lever 604. A driving shaft 606 of the lever 604 may be rotated to lift a raised portion 608 of a closing shaft 610 of the lever 604. The lifting of the raised portion 608 of the closing shaft 610 releases a trapped extended portion 612 of the loading plate 602. The loading plate 602 may then be raised to assume an open position. The loading plate is depicted in open position in FIG. 5A.

The loading plate 602 is depicted in closed position in FIG. 5B. In the closed position, two protruding portions 614 supported on arms of the loading plate 602 exert a socket actuation force on the IC package 400. When the loading plate 602 assumes an open position (depicted in FIG. 5A), the socket actuation force on the IC package 400 is released. The IC package 400 may then be removed using clearance provided by the grooves 208 in the two end walls 206 of the socket body 200. The loading plate 602 assumes a closed position to exert a socket actuation force on the IC package 400 to facilitate proper electrical contact between the first set of contacts of the IC package 400 and the array of contacts of the socket body 200. The socket actuation force applied by the loading plate 602 further results in the array of contacts of the socket body 200 exerting a force on the at least one connecting element of the interposer 300 to raise the flexible portion of the at least one connecting element. The raised flexible portion of the at least one connecting element makes electrical contact with the second set of contacts of the IC package 400 to provide access to one or more signals from the IC package 400.

The interposer, such as the interposer 300, disposed between an IC package and a socket body may provide access to specific desired signals from the IC package, such as debug signals. Moreover, the interposer is designed to be non-intrusive and has minimal signaling impact on the typical operations of the IC package. Further, the interposer in the form of a flexible circuit board may bend under or around any supporting mechanical structure around the socket body without affecting its functionality.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. An interposer for accessing one or more signals of a plurality of signals from an Integrated Circuit (IC) package, the interposer disposed between the IC package and a socket body, the socket body configured to receive the IC package, the interposer comprising:
   a plurality of clearance holes for allowing an array of contacts on a first surface of the socket body to pass through the interposer to make electrical contact with a first set of contacts of a plurality of contacts of the IC package; and
   at least one connecting element disposed between the plurality of clearance holes, the at least one connecting element configured to make electrical contact with a second set of contacts of the plurality of contacts of the IC package,
   wherein the electrical contact between the at least one connecting element and the second set of contacts of the plurality of contacts of the IC package provides access to the one or more signals of the plurality of signals from the IC package.

2. The interposer of claim 1, wherein the interposer is a flexible circuit board.

3. The interposer of claim 1, wherein the at least one connecting element comprises a flexible portion capable of being raised to make electrical contact with the second set of contacts of the plurality of contacts of the IC package.

4. The interposer of claim 1, wherein the one or more signals of the plurality of signals of the IC package are signals for debugging the IC package.

5. The interposer of claim 1, wherein the interposer further comprises extending portions extending out of the socket body.

6. The interposer of claim 5, wherein the extending portion routes the one or more signals accessed by the at least one connecting element out of the socket body to a debugging connector.

7. The interposer of claim 6, wherein the debugging connector is an In-Target Probe (ITP) connector.

8. The interposer of claim 1, wherein the socket body is a Land Grid Array (LGA) socket body.

9. A method for accessing one or more signals of a plurality of signals from an Integrated Circuit (IC) package, said method comprising:
 forming an interposer by:
  forming a plurality of clearance holes for allowing an array of contacts on a first surface of a socket body to pass through the interposer to make electrical contact with a first set of contacts of a plurality of contacts of the IC package; and
  disposing at least one connecting element between the plurality of clearance holes, the at least one connecting element configured to make electrical contact with a second set of contacts of the plurality of contacts of the IC package;
 providing access to the one or more signals of the plurality of signals from the IC package by forming electrical contact between the at least one connecting element and the second set of contacts of the plurality of contacts of the IC package; and
 disposing the interposer between the IC package and a socket body, the socket body configured to receive the IC package.

10. The method of claim 9, wherein the interposer is a flexible circuit board.

11. The method of claim 9, wherein the at least one connecting element comprises a flexible portion capable of being raised to make electrical contact with the second set of contacts of the plurality of contacts of the IC package.

12. The method of claim 9, wherein the one or more signals of the plurality of signals of the IC package are signals for debugging the IC package.

13. The method of claim 9, wherein the interposer further comprises extending portions extending out of the socket body.

14. The method of claim 9, wherein the extending portion routes the one or more signals accessed by the at least one connecting element out of the socket body to a debugging connector.

15. The method of claim 9, wherein the debugging connector is an In-Target Probe (ITP) connector.

16. The method of claim 9, wherein the socket body is a Land Grid Array (LGA) socket body.

\* \* \* \* \*